United States Patent [19]
Mumola

[11] Patent Number: 5,365,031
[45] Date of Patent: Nov. 15, 1994

[54] APPARATUS AND METHOD FOR SHIELDING A WORKPIECE HOLDING MECHANISM FROM DEPRECIATIVE EFFECTS DURING WORKPIECE PROCESSING

[75] Inventor: Peter B. Mumola, Huntington, Conn.

[73] Assignee: Hughes Aircraft Company, Los Angeles, Calif.

[21] Appl. No.: 855,404

[22] Filed: Mar. 23, 1992

[51] Int. Cl.$^5$ .............................................. B23K 9/00
[52] U.S. Cl. ........................ 219/121.43; 219/121.44; 437/938; 156/345
[58] Field of Search ........... 219/121.4, 121.43, 121.44, 219/121.48, 121.39; 156/345, 646; 204/298.36, 298.37, 298.17; 437/938; 269/289 R, 55, 57

[56] References Cited

U.S. PATENT DOCUMENTS

| | | | |
|---|---|---|---|
| 4,400,235 | 8/1983 | Coquin et al. | 156/343 |
| 4,439,261 | 3/1984 | Pavone et al. | 156/345 |
| 4,788,994 | 12/1988 | Shinbara | 156/345 |
| 4,838,979 | 7/1989 | Nishida et al. | 156/345 |
| 4,871,420 | 10/1989 | Alexander, Jr. et al. | 204/192.32 |
| 4,961,812 | 10/1990 | Baerg et al. | 156/345 |
| 4,968,374 | 11/1990 | Tsukada et al. | 204/298.31 |

FOREIGN PATENT DOCUMENTS 0385710 9/1990 European Pat. Off. .

*Primary Examiner*—Mark H. Paschall
*Attorney, Agent, or Firm*—M. E. Lachman; M. W. Sales; W. K. Denson-Low

[57] ABSTRACT

An apparatus for shielding a plurality of wafer registration surfaces 14, 30 and a wafer retention stage 26 from depreciative effects of a chemical etching process includes a pair of etching shields 32, 32' that are positioned along an outside edge of a wafer 10. The wafer 10 is registered to the wafer retention stage 26 by the registration surfaces 14, 30. The wafer retention stage 26, and hence the wafer 10, rotates about an axis 36 through the center of the wafer 10. A chemical etching instrument probe 18 is moved, with respect to the wafer 10, along a fixed wafer diameter 34 while the wafer 10 is rotating. The probe 18 is initially positioned above a first etching shield 32' and is moved, with respect to the wafer 10, across the wafer diameter 34 until it reaches a second etching shield 32. Thus, the probe 18 scans the entire surface of the wafer 10 without extending outside the wafer edge to depreciatively effect the wafer retention materials 14, 26, 30.

24 Claims, 5 Drawing Sheets

APPARATUS AND METHOD FOR SHIELDING A WORKPIECE HOLDING MECHANISM FROM DEPRECIATIVE EFFECTS DURING WORKPIECE PROCESSING

BACKGROUND OF THE INVENTION

1. Field of the Invention

The present invention relates to the deposition or removal of material to or from a workpiece, respectively, and, more particularly, to an apparatus and method for shielding a workpiece holding mechanism from depreciative effects during workpiece processing.

2. Description of the Prior Art

In one particular application wherein the present invention is especially practical, a silicon-on-insulator (SOI) semiconductor wafer, or some other variety of substrate material such as gallium arsenide, germanium, fused silica, quartz, silicon carbide, or diamond, is undergoing a chemical etching process. During this process, a chemical etching instrument induces a removal of material from a surface of the SOI semiconductor wafer. The material is removed as a result of a chemical reaction that occurs between the surface material of the SOI wafer and a plasma that is generated by the chemical etching instrument. Such an instrument is described in a related patent application entitled, System for Removing Material from a Wafer, U.S. Pat. Application Ser. No. 7/696,897, filed on May 7, 1991. As described in this system, a chemical etching instrument probe is scanned over the surface of a wafer in a controlled pattern. While scanning the wafer surface, the probe emits a plasma that induces a material removing chemical reaction. The scanning technique that is use in this system is commonly referred to as a boustrophedon type scan, or an XY bidirectional rastor scan.

A boustrophedon type scan operates in two orthogonal directions; i.e., the X and Y coordinate planes. In the material removal system of the above related patent application, the boustrophedon type scan of the chemical etching instrument operates by scanning the probe across the surface of the wafer in a positive and a negative X-coordinate plane direction, while indexing in a positive or a negative Y-coordinate plane direction. For example, the probe may scan across the wafer surface in the positive X-coordinate plane direction, index a predetermined distance in the positive Y-coordinate plane direction, scan across the wafer surface in the negative X-coordinate plane direction, and then index a further predetermined distance in the positive Y-coordinate plane direction. This scan pattern is repeated until the entire surface of the wafer is scanned.

Although the boustrophedon type scan permits the material removal system to accomplish its basic objective of scanning the entire wafer surface, the boustrophedon method results in a depreciative etching of wafer retention materials. These wafer retention materials typically consist of a surround, upon which the wafer is placed, and several tooled registration surfaces. The surround is secured to a wafer retention stage and the tooled registration surfaces axe secured to the surround. The wafer is registered to the surround, and hence to the wafer retention stage, by the tooled registration surfaces. Furthermore, the surround and the tooled registration surfaces axe typically the same material type as the wafer to ensure a consistent chemical reaction between the surface material of the wafer and the plasma.

The depreciative etching of the surround and the tooled registration surfaces occurs when the plasma emitting probe is extended outside the edge of the wafer during the indexing steps. This depreciative etching results in damage to the wafer retention materials. Understandably, these damaged wafer retention materials must be periodically replaced resulting in an additional expenditure of capital and labor.

As described above, the use of the boustrophedon type scanning method in a chemical etching process results in depreciated material replacement problems. It is therefore desirable to use a wafer surface scan scheme that does not result in depreciated material replacement problems in a chemical etching process.

SUMMARY OF THE INVENTION

The present invention contemplates an apparatus and method for shielding, for example, wafer retention materials from the depreciative effects of an SOI semiconductor wafer chemical etching process. Of course, the present invention also provides shielding from processes that are used for etching other materials such as gallium arsenide, germanium, fused silica, quartz, silicon carbide, or diamond. Regardless of the type of material being processed, the present invention is realized through the use of a pair of etching shields and an X-0 scan mechanism, In the case of the SOI semiconductor wafer chemical etching process, a wafer is placed on a wafer retention stage and registered to this stage by several registration surfaces. The wafer retention stage is capable of rotating about an axis through the center of the registered wafer. Two etching shields are positioned along the outside edge of the wafer, one at each end of the wafer diameter. If the wafer is rotationally symmetric, these shields can be fixedly positioned along the wafer edge. If the wafer is not rotationally symmetric (i.e., it has a flat), these shields can be positioned along the wafer edge by a cam mechanism that follows the edge contour of the wafer. Either way, the shields must be positioned as close as possible to the wafer edge, with the surface of the shields closely coinciding with the surface of the wafer. Furthermore, the etching shields must be made of the same material as the wafer, or a chemically inert material, to ensure a consistent and noncontaminating chemical etching process.

A chemical etching instrument probe is initially positioned over one of the etching shields. At the start of the chemical etching process, the wafer retention stage begins to rotate while the chemical etching instrument probe begins to emit plasma. Next, the position of the probe begins to move, with respect to the surface of the wafer, across the diameter of the wafer. This movement is such that while the wafer is rotating the position of the probe is moved, with respect to the surface of the wafer, along a fixed wafer diameter. This diametric movement continues until the probe is positioned over the second etching shield, at which time the probe stops emitting plasma. It should be noted that although the above description implies that the chemical etching instrument probe performs the aliametric movement, either the wafer retention stage or the chemical etching instrument probe may perform this diametric movement. Also, the diametric movement can be incremental to allow a number of concentric circle patterns to be formed between the probe and the wafer surface, or continuous to allow a spiral pattern to be formed between the probe and the wafer surface.

Throughout the above described chemical etching process, the position of the probe is not required to extend outside the diameter of the wafer, unless it is over one of the etching shields. Thus, the material removing effects of the chemical etching process are not inflicted upon the wafer retention materials, only the etching shields. Therefore, the wafer retention materials are not restricted to a specific material composition. Furthermore, as required by the chemical etching process, the entire surface of the wafer is either incrementally or continuously scanned by the plasma emitting probe. Overall, this shielding method is beneficial since a chemical etching process can be performed without having the undesirable effects of depreciative etching inflicted upon wafer retention materials.

The primary objective of the present invention is to provide an apparatus and method wherein a chemical etching process may be performed on a surface of a wafer without subjecting wafer retention materials to depreciative process effects.

Another objective of the present invention is to eliminate the requirement that a surround be used in a chemical etching process.

Another objective of the present invention is to eliminate the requirement that registration surfaces be of the same material type as a wafer undergoing a chemical etching process.

DESCRIPTION OF THE DRAWINGS

FIG. 3 includes a cross-sectional side-view of a wafer registration surface to illustrate the spacing relationship between a registration surface and a movable etching shield.

FIG. 5 includes a cross-sectional side view of a wafer registration surface to illustrate the spacing relationship between a registration surface and a stationary etching shield.

DETAILED DESCRIPTION OF THE PRESENT INVENTION

Figure 1:
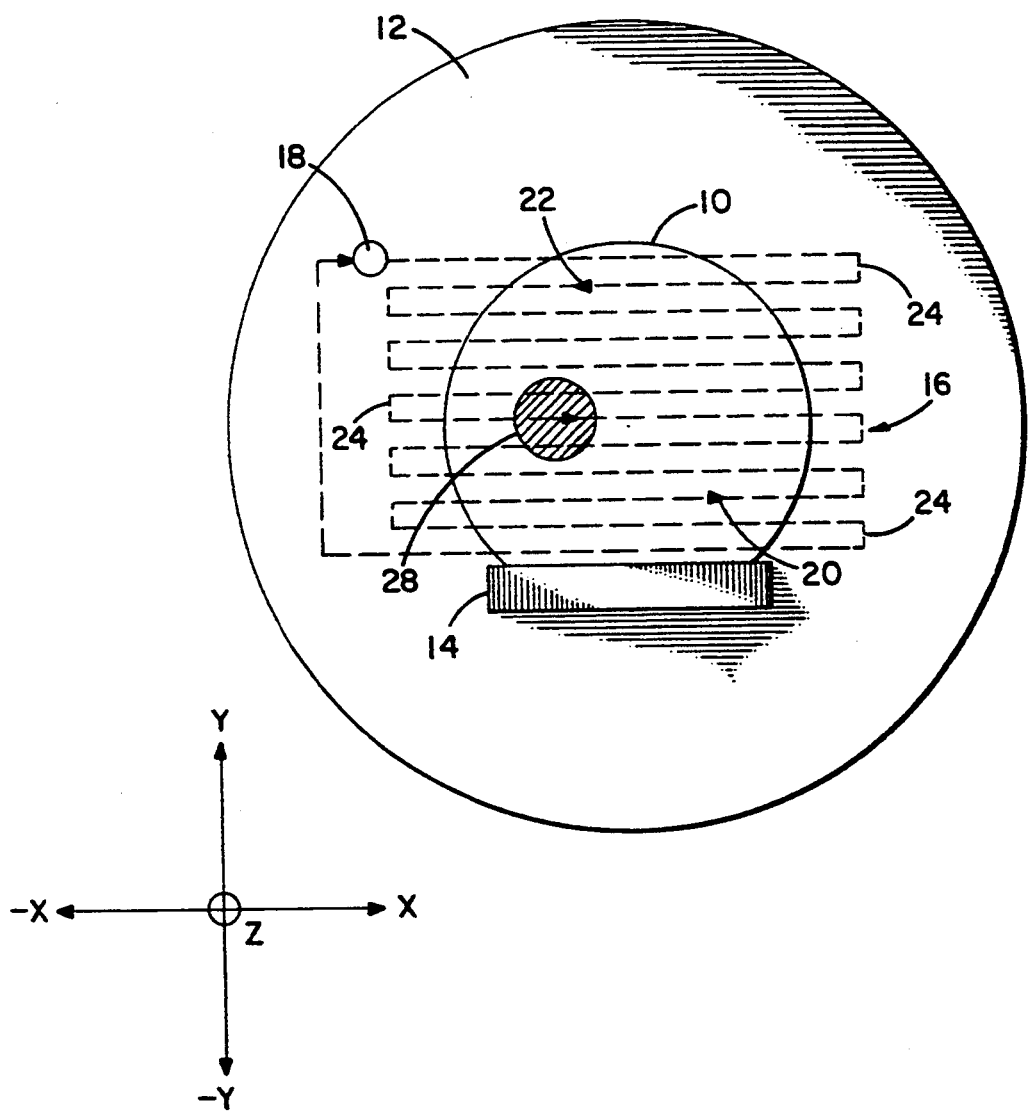
FIG. 1 illustrates a path pattern of a prior art boustrophedon type scan over a surround and an SOI semiconductor wafer.

Referring to FIG. 1, there is shown an SOI wafer 10 that is registered to a surround 12 by means of a wafer flat registration surface 14. The wafer flat registration surface 14 is secured to the surround 12. In the preferred embodiment of the present invention, additional registration surfaces are provided to consistently retain the wafer 10 in a precise registered position. However, to enhance the clarity of the figure, these additional registration surfaces are not shown. Also shown in FIG. 1, is a path pattern 16 of a prior art boustrophedon type scan. This path pattern 16 is maintained by a mechanical control means to ensure that a chemical etching instrument probe 18 is scanned over the entire surface of the wafer 10.

The chemical etching instrument probe 18 scans across the surface of the wafer 10 in a positive 20 and a negative 22 X-coordinate plane direction. While the probe 18 is scanned across the wafer surface, a chemical etching process occurs within an active region 28 around the probe 18. When scanned outside the edge of the wafer 10, the probe 18 performs indexing steps 24 in a negative Y-coordinate plane direction. During these indexing, or turnaround, steps 24 the surround 12 and the wafer registration surfaces 14 can be depreciatively etched as a result of the chemical etching process. This depreciative etching results in unnecessary wafer retention material replacement costs.

Figure 2:
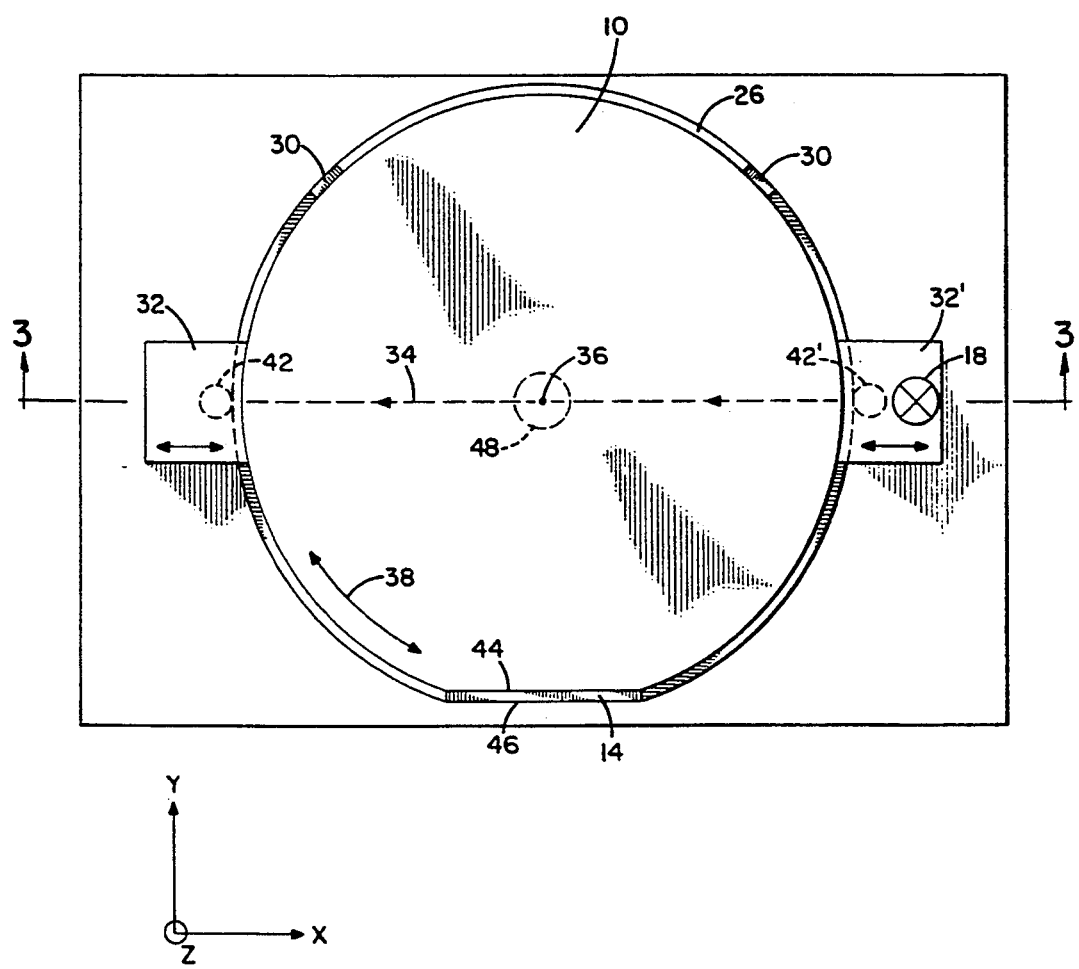
FIG. 2 is a top view taken along line 2—2 of FIG. 3, of an apparatus with movable etching shields that shields wafer retention materials from the depreciative etching effects of an SOI semiconductor wafer chemical etching process according to the present invention.

Referring to FIG. 2, there is shown an SO1 wafer 10 that is registered directly to a rotatable wafer retention stage 26 by means of a wafer flat registration surface 14 and two additional registration surfaces 30. The wafer retention stage 26 is constructed to mimic the shape of the wafer 10, only on a slightly larger scale, including a flat 46 which is positioned to correspond with the position of the wafer flat 44 and the wafer flat registration surface 14. Along the outside edge of the wafer 10, at opposite ends of the wafer diameter 34, there are two etching shields 32, 32' that are positioned by two cam mechanisms 42, 42', respectively. Each cam mechanism 42 rides up against the edge of the wafer retention stage 26 to maintain the corresponding etching shield 32 at a consistent distance to the wafer 10. Thus, when the wafer retention stage 26 is rotated to a point where the wafer retention stage flat 46 is in contact with the cam mechanism 42, the position of the etching shield 32 is adjusted to maintain the consistent distance to the wafer 10. This distance is typically on the order of 0.5 mm as compared to a distance of approximately 1.0 mm from the surface of the wafer 10 to the top of the shield 32. These distances are critical in preventing the chemical etching process plasma from reaching the wafer retention materials 14, 26, 30 and in maintaining a consistent chemical etching process along the wafer surface, respectively. Furthermore, the etching shields 32, 32' are typically required to be the same material type as the wafer, or a chemically inert material, to ensure a consistent and noncontaminating chemical reaction during the chemical etching process. This requirement, however, is no longer stipulated for the wafer retention materials 14, 26, 30, as was the case for the apparatus in FIG. 1.

A chemical etching instrument probe 18 is initially positioned above the first etching shield 32'. In this position, the probe 18 is initialized with an emission of plasma. Once initialized, the probe 18 moves, with respect to the surface of the wafer 10, along the wafer diameter 34 toward the second etching shield 32. During this diametric movement, the wafer retention stage 26, and hence the wafer, rotates under the control of a motor driven shaft 48 about an axis through the center of the wafer 36. The direction 38 of the wafer 10 rotation is not relevant to the operation of the present invention. However, the interaction between this rotation and the respective diametric movement of the chemical etching probe 18 is relevant in determining the path pattern that is made between the probe 18 and the surface of the wafer 10. Obviously, the speed of the rotation must be controlled to ensure that the probe 18 has a sufficient amount of dwell time over the wafer 10 at the points where etching is desired. But also, the respective diametric movement of the probe 18 must be controlled either incrementally to allow a number of concentric circle patterns to be formed between the probe 18 and the surface of the wafer 10, or continuously to allow a spiral pattern to be formed between the probe 18 and the surface of the wafer 10. Either way, once the probe 18 reaches a position above the second etching shield 32, the entire surface of the wafer 10 will have been scanned. It should be noted that although the above description implies that the chemical etching instrument probe 18 performs the diametric movement, either the wafer retention stage 26 or the chemical etching instrument probe 18 is capable of performing this movement.

Figure 3:
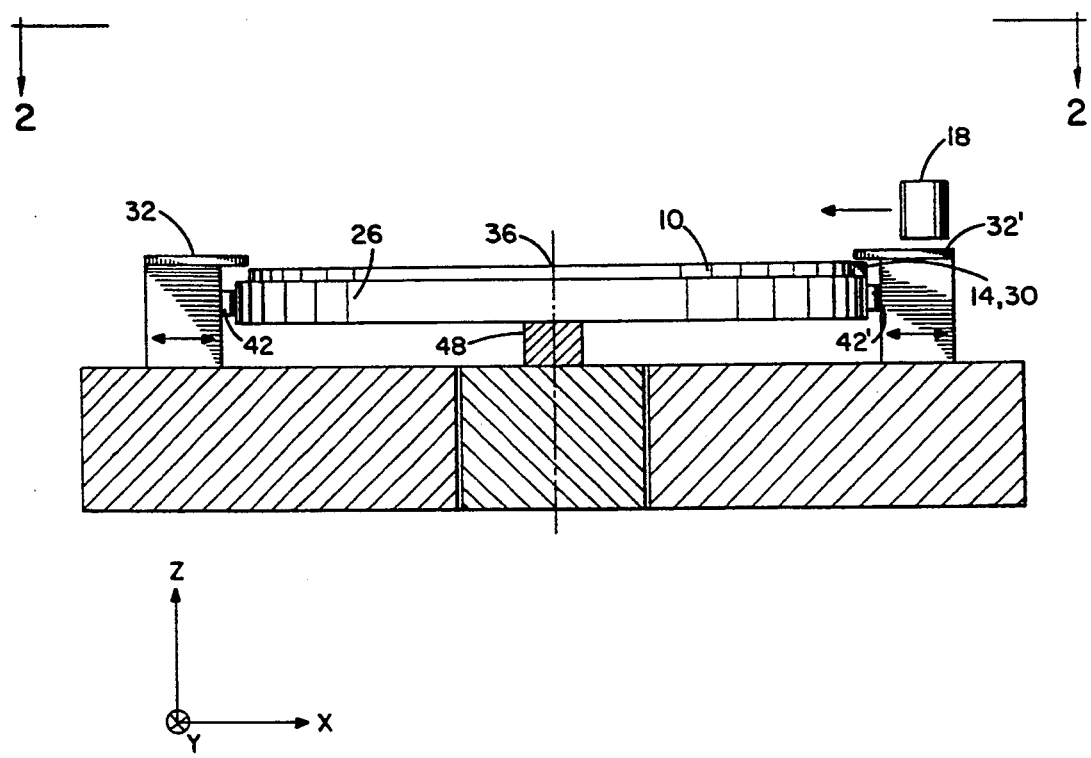
FIG. 3 is a cross-sectional side view taken along line 3—3 of FIG. 2, of the apparatus that shields wafer retention materials from the depreciative etching effects of an SOI semiconductor wafer chemical etching process according to the present invention.

Referring to FIG. 3, there is shown a cross-sectional side view of the apparatus in FIG. 2. In this view it can be seen how the etching shields 32, 32' are positioned with respect to the edge and surface of the SOI wafer 10. This positioning of the etching shields 32, 32' allows the wafer flat registration surface 14 and the two additional wafer registration surfaces 30 to pass beneath the shields 32, 32' while the wafer retention stage 26, and hence the wafer registration surfaces 14, 30, are rotating. Furthermore, this positioning is such that the material removal effects of the chemical etching process do not affect the wafer retention materials 14, 26, 30. Thus, there is no longer a need for a wafer surround material 12 as described in the prior art of FIG. 1, and the registration surfaces 14, 30 no longer need to be of the same material type as the wafer 10.

Figure 4:
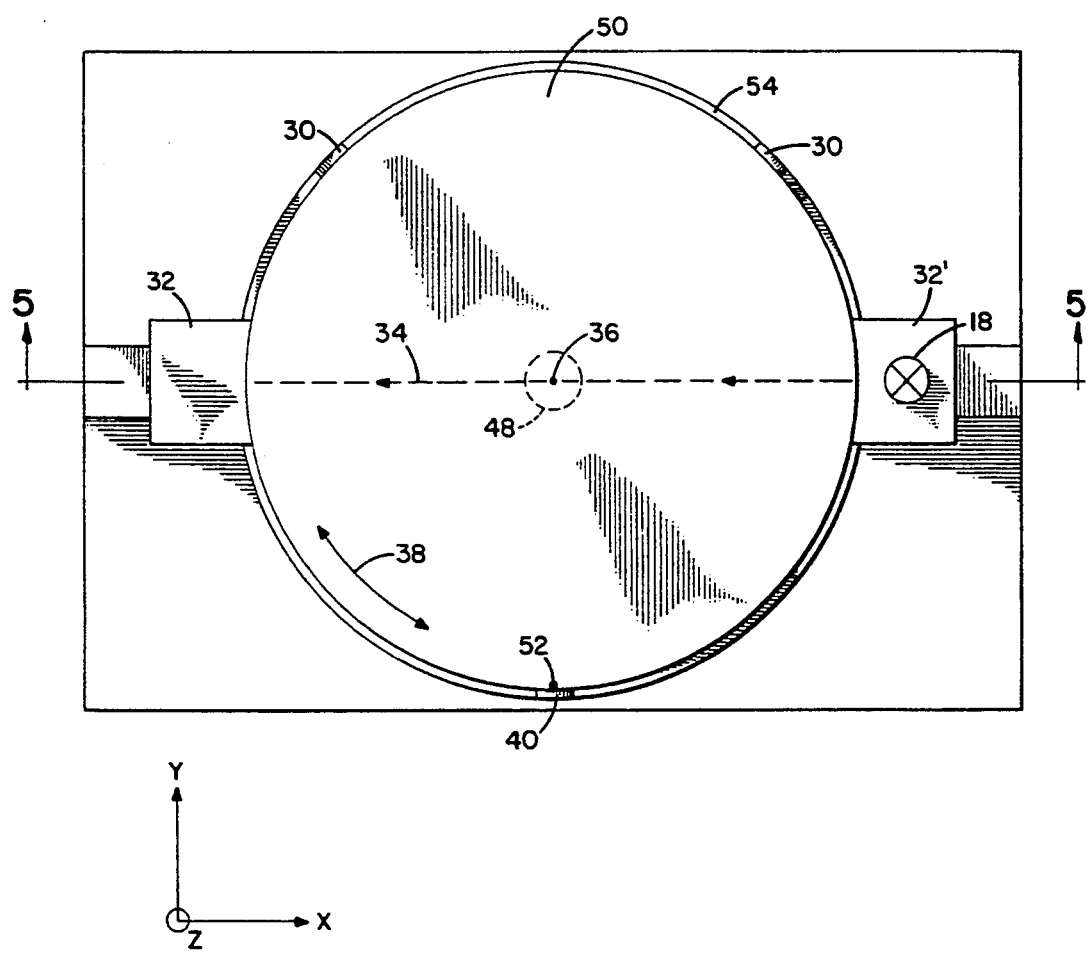
FIG. 4 is a top view taken along line 4—4 of FIG. 5, of an apparatus with stationary etching shields that shields wafer retention materials from the depreciative effects of an SOI semiconductor wafer chemical etching process according to the present invention.

Referring to FIG. 4, there is shown a notched SOI wafer 50 that is registered directly to a wafer retention stage 54 by means of a wafer notch registration surface 40 and two additional wafer registration surfaces 30. In this apparatus, the two etching shields 32, 32' are fixedly positioned along the outside edge of the wafer 10, one at each end of the wafer diameter 34. Since the wafer 50 is circular except for a notch 52 for registration, the position of the etching shields 32, 32' do not have to be adjusted as with the apparatus in FIGS. 2 and 3. Understandably, the shape of the wafer retention 54 stage is no longer required to mimic the shape of the wafer 50. Otherwise, the apparatus of FIG. 4 operates in the same manner as the apparatus shown in FIGS. 2 and 3.

Figure 5:
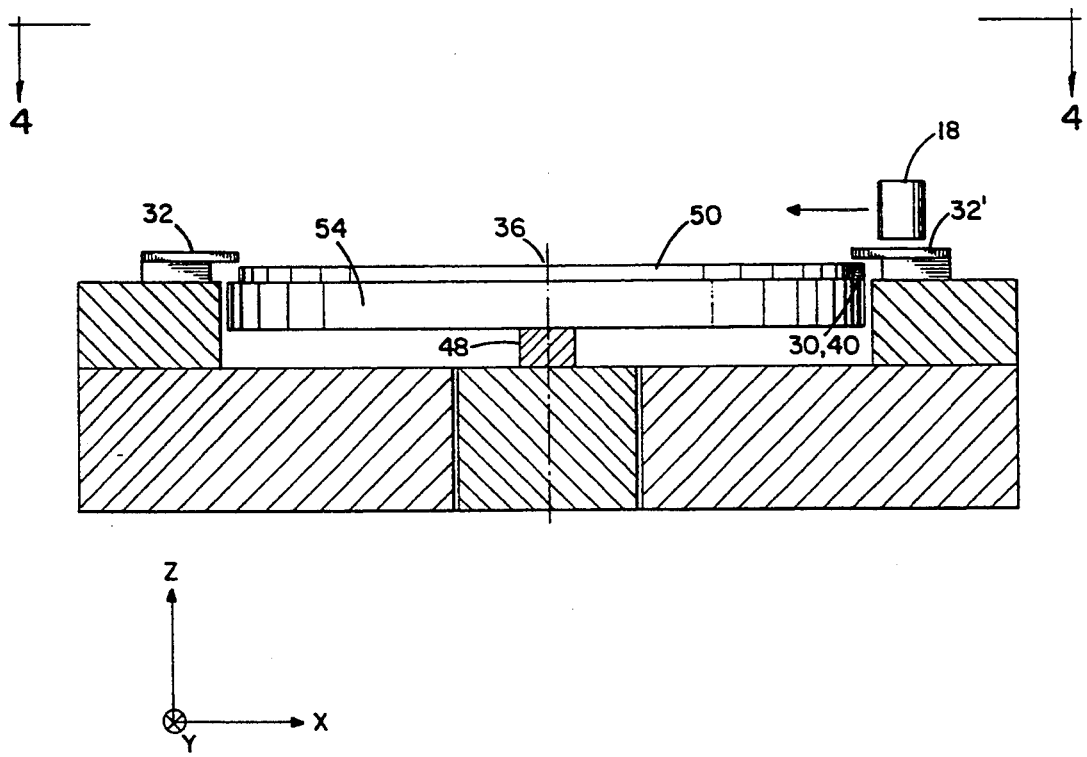
FIG. 5 is a cross-sectional side view taken along line 5—5 of FIG. 4, of the apparatus that shields wafer retention materials from the depreciative effects of an SOI semiconductor wafer chemical etching process according to the present invention.

Referring to FIG. 5, there is shown a cross-sectional side view of the apparatus in FIG. 4. In this view it can be seen how the etching shields 32, 32' are fixedly positioned with respect to the edge and surface of the notched SO1 wafer 50. Otherwise, the apparatus in FIG. 5 operates in the same manner as the apparatus in FIGS. 2 and 3.

It is thus seen that the objectives set forth above are efficiently attained and, since certain changes may be made in the above described apparatus and method without departing from the scope of the invention, it is intended that all matter contained in the above description or shown in the accompanying drawings shall be interrupted as illustrative and not in a limiting sense.

What is claimed is:

1. An apparatus for shielding a holding mechanism of a workpiece from depreciative effects during processing of said workpiece, said apparatus comprising:

means for rotating said workpiece;

means for holding said workpiece to said rotating means;

means for positioning said processing of said workpiece along a diameter of said rotating workpiece wherein said processing does not extend outside said diameter; and means for shielding said rotating means and said holding means from said positioned processing of said rotating workpiece wherein said means for shielding is located along the outside edge of said diameter of said workpiece and allows said rotating means and said holding means to pass therebeneath.

2. An apparatus as described in claim 1, wherein said means for rotating said workpiece is a wafer retention stage, wherein said wafer retention stage can rotate in either a clockwise or counterclockwise direction about an axis through the center of said workpiece.

3. An apparatus as described in claim 1, wherein said means for holding said workpiece to said rotating means comprises a plurality of workpiece edge registration surfaces.

4. An apparatus as described in claim 1, wherein said workpiece is a semiconductor wafer, and wherein said means for holding said workpiece to said rotating means comprises:

a wafer flat registration surface; and a plurality of additional registration surfaces.

5. An apparatus as described in claim 1, wherein said means for positioning said processing of said workpiece along a diameter of said rotating workpiece comprises a means for diametrically moving said rotating workpiece under a stationary workpiece processing instrument.

6. An apparatus as described in claim 5, wherein said means for diametrically moving said rotating workpiece is a movable wafer retention stage.

7. An apparatus as described in claim 6, wherein said workpiece is a semiconductor wafer, and wherein said stationary workpiece processing instrument is a chemical etching instrument.

8. An apparatus as described in claim 1, wherein said means for positioning said processing of said workpiece along a diameter of said rotating workpiece comprises a means for diametrically moving a workpiece processing instrument along said diameter of said rotating workpiece.

9. An apparatus as described in claim 8, wherein said means for diametrically moving said workpiece processing instrument is a movable workpiece processing instrument.

10. An apparatus as described in claim 9, wherein said workpiece is a semiconductor wafer, and wherein said movable workpiece processing instrument is a chemical etching instrument.

11. An apparatus as described in claim 1, wherein said means for shielding said rotating means and said holding means from said positioned processing of said rotating workpiece comprises a plurality of stationary etching shields, wherein said plurality of stationary etching shields are fixedly positioned along an outside edge of said rotating workpiece, and wherein said plurality of stationary etching shields shield said rotating means and said holding means from said positioned workpiece processing.

12. An apparatus as described in claim 11, wherein said plurality of stationary etching shields are two stationary etching shields, and wherein said two stationary etching shields are fixedly positioned at opposite ends of said diameter of said rotating workpiece.

13. An apparatus as described in claim 12, wherein said two stationary etching shields are made of a material that ensures a consistent and noncontaminating workpiece processing.

14. An apparatus as described in claim 13, wherein said rotating workpiece is a semiconductor wafer, and wherein said two stationary etching shields are made of the same material type as said semiconductor wafer to ensure a consistent and noncontaminating chemical etching process.

15. An apparatus as described in claim 1, wherein said means for shielding said rotating means and said holding means from said positioned processing of said rotating workpiece comprises a plurality of movable etching shields, wherein said plurality of movable etching shields are movably positioned along an outside edge of said rotating workpiece, wherein said movement of each of said plurality of movable etching shields is controlled by a cam riding against a contour of said outside edge of said rotating workpiece, and wherein said plurality of movable etching shields shield said rotating means and said holding means from said positioned workpiece processing.

16. An apparatus as described in claim 15, wherein said plurality of movable etching shields are two movable etching shields, and wherein said two movable etching shields are movably positioned at opposite ends of said diameter of said rotating workpiece.

17. An apparatus as described in claim 16, wherein said two movable etching shields are made of a material that ensures a consistent and noncontaminating workpiece processing.

18. An apparatus as described in claim 17, wherein said rotating workpiece is a semiconductor wafer, and wherein said two movable etching shields are made of the same material type as said semiconductor wafer to ensure a consistent and noncontaminating chemical etching process.

19. A method for shielding a holding mechanism of a workpiece from depreciative effects during processing of said workpiece, said method including the steps of:

holding said workpiece to a retention stage by a plurality of workpiece edge registration surfaces;

rotating said wafer retention stage, and hence said held workpiece, about an axis through the center of said held workpiece;

positioning said processing of said workpiece along a diameter of said rotating workpiece wherein said processing does not extend outside said diameter; and shielding said retention stage and said plurality of workpiece edge registration surfaces from said positioned workpiece processing by passing beneath a shielding means.

20. A method as described in claim 19, wherein said step of holding said workpiece to a retention stage by a plurality of workpiece edge registration surfaces includes the substep of registering said workpiece to said retention stage by said plurality of workpiece edge registration surfaces.

21. A method as described in claim 19, wherein said step of positioning said processing of said workpiece includes the substep of diametrically moving said rotating workpiece with respect to a stationary workpiece processing instrument.

22. A method as described in claim 19, wherein said step of positioning said processing of said workpiece includes the substep of moving a workpiece processing instrument along said diameter of said rotating workpiece.

23. A method as described in claim 19, wherein said step of shielding said retention stage and said plurality of workpiece edge registration surfaces includes the substep of fixedly positioning a pair of stationary etching shields along an outside edge of said rotating workpiece at opposite ends of said rotating workpiece diameter.

24. A method as described in claim 19, wherein said step of shielding said retention stage and said plurality of workpiece edge registration surfaces includes the substep of movably positioning a pair of movable etching shields along an outside edge of said rotating workpiece at opposite ends of said rotating workpiece diameter.

* * * * *